(12) United States Patent
Sakai et al.

(10) Patent No.: US 6,741,230 B2
(45) Date of Patent: May 25, 2004

(54) LEVEL SHIFT CIRCUIT AND IMAGE DISPLAY DEVICE

(75) Inventors: Tamotsu Sakai, Tenri (JP); Yasuyuki Ogawa, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 193 days.

(21) Appl. No.: 09/759,510

(22) Filed: Jan. 16, 2001

(65) Prior Publication Data

US 2001/0008381 A1 Jul. 19, 2001

(30) Foreign Application Priority Data

Jan. 19, 2000 (JP) ........................................ 2000-010813
Nov. 15, 2000 (JP) ................................................ 348672

(51) Int. Cl.$^7$ ................................................. G09G 3/36
(52) U.S. Cl. ........................... 345/99; 345/100; 326/62; 326/68; 326/80; 326/81; 327/333; 327/437; 327/534; 327/535; 307/264; 307/296.3; 307/475; 307/494
(58) Field of Search ..................... 345/99, 100; 326/62, 326/68, 80, 81; 327/534, 333, 535, 437; 307/475, 494, 264, 296.3

(56) References Cited

U.S. PATENT DOCUMENTS

| | | | | |
|---|---|---|---|---|
| 4,920,284 A | * | 4/1990 | Denda | 307/475 |
| 6,043,699 A | * | 3/2000 | Shimizu | 327/333 |
| 6,118,438 A | * | 9/2000 | Ho | 345/204 |
| 6,127,998 A | * | 10/2000 | Ichikawa et al. | 345/100 |
| 6,166,957 A | * | 12/2000 | Chung et al. | 365/185.23 |
| 6,307,398 B2 | * | 10/2001 | Merritt et al. | 326/81 |

FOREIGN PATENT DOCUMENTS

JP             10-190438        7/1998

* cited by examiner

*Primary Examiner*—Regina Liang
*Assistant Examiner*—Jennifer T. Nguyen
(74) *Attorney, Agent, or Firm*—Nixon & Vanderhye, PC

(57) ABSTRACT

Upon generating an inversion input signal to be inputted to a level shifter section in an inverter section, a voltage VHL, which gives an output voltage of a high level in the inverter section, is generated by a resistance division from the power supply voltages VHH and VLL in a voltage-dividing section. Thus, it becomes possible to provide a level shift circuit which can realize a reduction in the number of terminals and low power consumption by using a simple circuit construction.

30 Claims, 11 Drawing Sheets

LEVEL SHIFT CIRCUIT AND IMAGE DISPLAY DEVICE

FIELD OF THE INVENTION

The present invention relates to a level shi ft circuit, and more particularly to a level shift circuit which is operated by an input signal and an inversion input signal.

BACKGROUND OF THE INVENTION

FIG. 10 shows a structural example of a conventional level shift circuit. This level shifter circuit has a level shifter section 101 that is constituted by four MOS transistors, that is PMOS transistors P81 and P82, and NMOS transistors N81 and N82.

The PMOS transistor P81 and the NMOS transistor N81 are series-connected to each other between power supply voltages VHH and VLL through a terminal of an inversion output signal OUT B. In the same manner, the PMOS transistor P82 and the NMOS transistor N82 are also series-connected between power supply voltages VHH and VLL through a terminal of an output signal OUT. Moreover, the output signal OUT also serves as an input for the gate of the PMOS transistor P81, and the inversion output signal OUT B also serves as an input for the gate of the PMOS transistor P82.

An input signal IN is inputted to the gate of the NMOS transistor N81. An inversion input signal IN B, obtained by inverting the input signal IN in an inverter section 102, is inputted to the gate of the NMOS transistor N82. The inverter section 102 has a construction in which a PMOS transistor P83 and a NMOS transistor N83 are series-connected to each other between power supply voltages VHL and VLL.

In the level shift circuit having the above-mentioned construction, upon receipt of a low-level (voltage VL) signal as the input signal IN, the NMOS transistor N81 is turned off. Moreover, the input signal IN is also applied to the gates of the PMOS transistor P83 and the NMOS transistor N83 of the inverter section 102 so that the PMOS transistor P83 is turned on while the NMOS transistor N83 is turned off. In other words, the output from the inverter section 102 forms an output voltage VHL with only the PMOS transistor P83 being turned on.

Consequently, the inversion input signal IN B with High level (voltage VHL), obtained by inverting the input signal IN, is inputted to the NMOS transistor N82 to turn it on. For this reason, on the drain side of the NMOS transistor N82, the level of the output signal OUT is set to the VLL level. The PMOS transistor P81 having the output signal OUT connected to the gate thereof is turned on, since the gate level is lowered to the VLL level, with the result that on the drain side thereof, the level of the inversion output signal OUT B is set to the VHH level. The PMOS transistor P82, which has the inversion output signal OUT B with the VHH level as its gate input, is turned off.

As described above, in the level shift circuit, upon receipt of the input signal IN with the low level (voltage VL), the output signal OUT B is set to the VLL level and the inversion output signal OUT is set to the VHH level; thus, they are stabilized. In contrast, in the case when the input signal IN goes to the high level (voltage VH), the output signal OUT is set to the VHH level, and the inversion output signal OUT B is set to the VLL level; thus, they are stabilized.

In the arrangement of FIG. 10, the inverter section 102 is used in order to obtain the inversion input signal IN B to be inputted to the gate of the NMOS transistor N82; however, as illustrated in FIG. 11, even in the case when the inverter section 102 is removed, the same level shift operation may be carried out by inputting the signal IN B from outside.

However, in the above-mentioned conventional level shift circuit shown in FIG. 10, in addition to the power supply voltages (VHH, VLL) used for the circuits after having been subjected to the level shift, another power supply voltage (VHL) used for the inverter section 102 that generates the inversion input signal used before the level shift. These power supplies need to be inputted to the level shift circuit from outside, resulting in an increase in the number of terminals in the circuits.

Moreover, in the level shift circuit shown in FIG. 11, the inversion input signal IN B is generated by an external circuit, and inputted to the level shift circuit; however, in this case, since most of the signals that need to be inputted from outside require inversion signals thereof, this also results in an increase in the number of terminals.

SUMMARY OF THE INVENTION

One objective of the present invention is to provide a level shift circuit which can achieve a reduction in the number of input terminals as well as low power consumption, by using a simplified circuit construction, and also to provide an image display device using such a level shift circuit.

In order to achieve the above-mentioned objective, a level shift circuit in accordance with the present invention is provided with: a level shifter means, having an input signal and an inversion input signal formed by inverting the high/low level of the input signal inputted thereto, with a first voltage that is a high power-supply voltage and a second voltage that is a low power-supply voltage being connected thereto, which, based upon the high/low level of the input signal and inversion input signal, switches the first voltage and the second voltage to output the resulting voltage; an inversion input signal generation means, having the input signal, either of the first voltage and the second voltage, and a third voltage that gives an output level corresponding to the low level or the high level of the inversion input signal, inputted thereto, which, based upon the high/low level of the input signal, switches the output voltage level so as to generate an inversion input signal formed by inverting the input signal; and a voltage-dividing means which voltage-divides and extracts the third voltage between the first and second voltages.

In the case when the input signal and the inversion input signal formed by inverting the input signal are required as input signals to the level shifter, the third voltage that gives the output level corresponding to the low level or the high level of the inversion input signal needs to be prepared in addition to the first and second voltages that give the low level or the high level of the output signal.

In conventional devices, the third voltage has been supplied as a power supply voltage supplied from outside the level shift circuit; therefore, the corresponding terminals have been required. However, in the above-mentioned construction, the third voltage is generated by the voltage-dividing processes based upon the first and second voltages carried out by the voltage-dividing means. For this reason, it is possible to eliminate the terminal through which the third voltage is inputted, and consequently to reduce the number of terminals in the level shift circuit.

Moreover, in the level-shift circuit of the present invention which, in response to the input signal inputted from outside, generates an inversion input signal that is the corresponding inversion signal inside thereof, and based upon the high/low level of the input signal and the inversion input signal, shifts the level of the input signal so as to output the resulting signal, the voltage, which gives the output level of the low level or high level of the inversion input signal, is generated by a resistance division from the power supply voltage that gives the output level of the output signal that has been level-shifted.

In the case when the input signal and inversion input signal are used in the conventional level shift circuit, with respect to the inversion input signal, two cases in which it is inputted from outside in the same manner as the input signal and in which it is generated inside thereof have been proposed. In the case when the inversion input signal is inputted from outside, the corresponding input terminal is required in the level shift circuit. Moreover, even in the case when the inversion input signal is generated inside thereof, in addition to the power-supply voltage for providing the output level of the output signal that has been level-shifted, another voltage for providing the output level of the low level or high level of the inversion input signal is required; consequently, the corresponding terminal for supplying this voltage is required.

In contrast, in the construction of the level shift circuit of the present invention, the voltage, which gives the output level of the low level or high level of the inversion input signal, is generated by a resistance division from the power supply voltage that gives the output level of the output signal that has been level-shifted. That is, in the above-mentioned level shift circuit, only the terminal for inputting the power supply voltage for providing the output level of the output signal that has been level-shifted is required, resulting in a reduction in the number of the terminals.

Moreover, an image display device in accordance with the present invention, which is an active-matrix-type image display device having display pixels arranged in a matrix format, is characterized in that the data signal driving circuit and the scanning signal driving circuit have the above-mentioned level shift circuit.

In the above-mentioned image display device, it is possible to reduce the number of terminals in the data signal driving circuit and the scanning signal driving circuit.

For a fuller understanding of the nature and advantages of the invention, reference should be made to the ensuing detailed description taken in conjunction with the accompanying drawings.

BRIEF DESCRIPTION OF THE DRAWINGS

FIG. 2(a) exemplifies a case in which NMOS transistors are used, and

FIG. 2(b) exemplifies a case in which PMOS transistors are used.

FIG. 3(a) exemplifies a case in which NMOS transistors are used, and FIG. 3(b) exemplifies a case in which PMOS transistors are used.

FIG. 6(a) shows a case in which the input of the gate voltage is switched between VLL (low level) and VLL+5V (high level), and FIG. 6(b) shows a case in which the input of the gate voltage is switched between VLL (low level) and VLL+6V (high level).

FIG. 7(a) shows a case in which the input of the gate voltage is switched between VHH (high level) and VJIH−5V (low level), and FIG. 7(b) shows a case in which the input of the gate voltage is switched between VHH (high level) and VHH−6V (low level).

DESCRIPTION OF THE EMBODIMENTS

Figure 1:
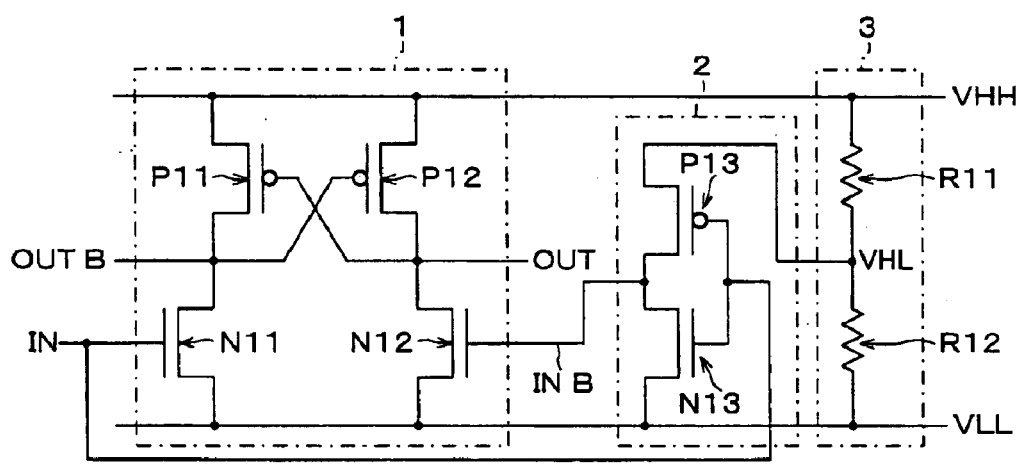
FIG. 1, which shows one embodiment of the present invention, is a circuit diagram that shows the construction of a level shift circuit.

FIG. 1 shows a structural example of a level shift circuit in accordance with the present embodiment. A level shifter section 1 in the level shift circuit is constituted by four MOS transistors, that is, PMOS transistors P11 and P12 and NMOS transistors N11 and N12.

The PMOS transistor P11 and the NMOS transistor N11 are series-connected through a terminal of an inversion output signal OUT B between power supply voltages VHH and VLL. In the same manner, the PMOS transistor P12 and the NMOS transistor N12 are series-connected through a terminal of an output signal OUT between power supply voltages VHH and VLL. Moreover, the output signal OUT is also applied to the gate of PMOS transistor P11 as an input, and the inversion output signal OUT B is also applied to the gate of the PMOS transistor P12 as an input.

An input signal IN is inputted to the gate of the NMOS transistor N11. The inversion input signal IN B, obtained by inverting the input signal IN in an inverter section (inversion input signal generation means) 2, is inputted to the gate of the NMOS transistor N12. The inverter section 2 has a construction in which a PMOS transistor P13 and an NMOS transistor N13 are series-connected between the power supply voltages VHL and VLL.

In the level shift circuit having the above-mentioned construction, upon receipt of a low-level signal (voltage VL) as the input signal IN, the NMOS transistor N11 is turned off. Moreover, the input signal IN is also applied to the gates of the PMOS transistor P13 and the NMOS transistor N13 of the inverter section 2; thus, the PMOS transistor P13 is turned on, while the NMOS transistor N13 is turned off. In other words, the output from the inverter section 2 is allowed to form an output voltage of VHL, since only the PMOS transistor P13 is turned on.

With this arrangement, upon receipt of the inversion input signal IN B of the high level (voltage VHL) formed by inverting the input signal IN, the NMOS transistor N12 is turned on. The level of the output signal OUT becomes the VLL level at the drain of the NMOS transistor N12. The PMOS transistor P11 having the gate to which the output signal OUT is connected is turned on since the gate level becomes VLL, with the drain having the level of the inversion output signal OUT B of the VHH level. The PMOS transistor P12, which receives the inversion output signal OUT B of the VHH level as the gate input, is turned off. Here, in the explanation of the present embodiment, with respect to the NMOS transistor, the low voltage side forms the source, and the high voltage side forms the drain. With respect to the PMOS transistor, the high voltage side forms the source, and the low voltage side forms the drain.

As described above, in the above-mentioned level shift circuit, in the case when the input signal IN of the low level (voltage VL) is inputted, the output signal OUT is set to the VLL level and the inversion output signal OUT B is set to the VHH level, thereby being stabilized. In contrast, in the case when the input signal IN of the high level (voltage VH) is inputted, the output signal OUT is set to the VHH level and the inversion output signal OUT B is set to the VLL level, thereby being stabilized. Normally, in the input signal IN, the voltage VH of the high level is set to the same electric potential as the voltage VHL, and the voltage VL of the low level is set to the same electric potential as the voltage VLL.

Here, in the inverter section 2 constituted by the PMOS transistor P13 and the NMOS transistor N13, the voltage VHL (third voltage), supplied as the output on the high level side, is generated by voltage-dividing the power supply voltages VHH (first voltage) and VLL (second voltage) by using a voltage-dividing section (voltage-dividing means) 3. The voltage-dividing section 3, which is formed by series-connecting resistors R11 and R12 between the power supply voltages VHH and VLL, is allowed to draw voltages between the resistors so that the voltages VHH and VLL are voltage-divided to generate a voltage VHL.

The voltage VHL, generated by the resistor-divided voltages, has virtually the same level as the high level voltage VH of the input signal IN; however, this may be set to a voltage value different from VH as long as the voltage allows the level shifter section 1 to operate. More specifically, the value of the VHL is determined by the threshold voltage of the NMOS transistor N12 having the gate input to which this is inputted.

The value of the VHL is determined by the ratio of the resistances of the resistors R11 and R12, while the value of the constant current is determined by the total of the resistances, and the above-mentioned value can be changed in accordance with operation speeds of the respective signals. In the case when the level shift circuit is operated by a high-frequency signal, upon receipt of the input signal IN of the low level voltage VL, the inversion input signal IN B forms the high level voltage VHL; therefore, a current which can form an output of the VHL level in a short time is required, and this is achieved by reducing the total resistance of the resistors R11 and R12.

In contrast, in the case when a signal which has a low frequency and hardly gives any influences on the timing of the signal is used, it is possible to greatly reduce the constant current by increasing the total resistance of the resistors R11 and R12. For this reason, in the case of dealing with a low-frequency signal, the level shift circuit of the present embodiment makes it possible not only to reduce the number of the input terminals but also to greatly reduce the power consumption.

Moreover, the resistors R11 and R12 in the voltage-dividing section 3 are preferably constituted by semiconductor elements, and in this case, a high resistance is stably provided even by the use of a small area. Here, even when a larger area is required, they may be superposed on the surface or on the rear surface of the metal wiring so that free spaces of the wiring section, etc. may be effectively utilized; thus, it becomes possible to save space in the circuit. The above-mentioned semiconductor elements maybe provided as either an n-type semiconductor (for example, silicon doped by phosphor as a donor), or a p-type semiconductor (for example, silicon doped by boron as an acceptor).

Figure 2A:
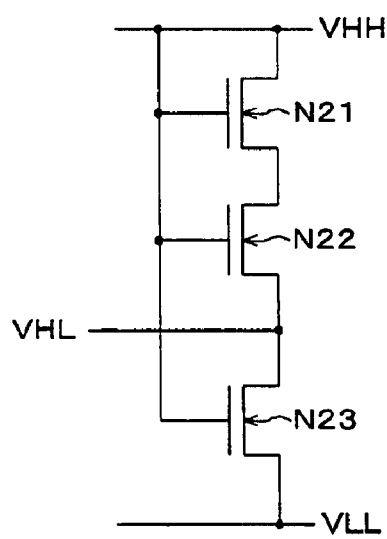
FIGS. 2(a) and 2(b) are circuit diagrams that show structural examples of a case in which the voltage-dividing section of the level shift circuit is constituted by transistors.

Furthermore, the respective resistors in the voltage-dividing section 3 may be constituted by MOS transistors. FIG. 2(a) shows a case in which NMOS transistors are used, and in this case, NMOS transistors N21, N22 and N23 having the same channel length are series-connected between the power supplies VHH and VLL, with the gates of the respective NMOS transistors N21, N22 and N23 being connected to the power supply voltage VHH. Here, the output voltage VHL is extracted from the connecting section of the NMOS transistors N22 and N23.

Moreover, the channel lengths of the NMOS transistors may be set to have different sizes so as to obtain a desired voltage.

Figure 2B:
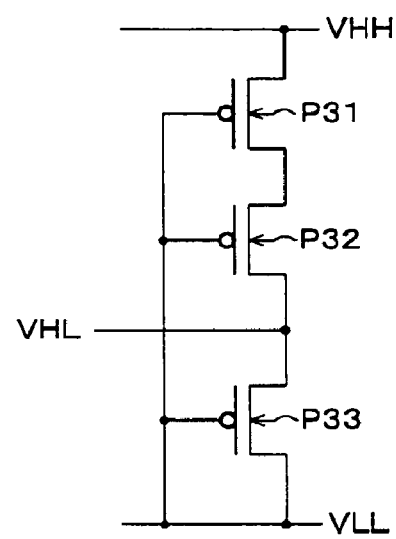

Here, the number of the NMOS transistors and the extraction points of the output power supply are not particularly limited, and these need to be properly adjusted depending on the properties of transistors so as to obtain a desired voltage and current. Moreover, as illustrated in FIG. 2(b), instead of the NMOS transistors, PMOS transistors may be used. In this case, the gates of the respective PMOS transistors P31, P32 and P33 are connected to the power-supply voltage VLL.

Moreover, in the construction of the voltage-dividing section 3 shown in FIG. 2(a), all the gates of the NMOS transistors series-connected between the power supply voltages VHH and VLL are connected to the high power-supply voltage VHH; however, the gates of the NMOS transistors may be connected to the drains of their own. In other words, as illustrated in FIG. 3(a), the gate of the NMOS transistor N41 may be connected to the power supply VHH, the gate of the NMOS transistor N42 may be connected to x42, and the gate of the NMOS transistor N43 may be connected to the output voltage VHL of the voltage-dividing section 3.

Figure 3:
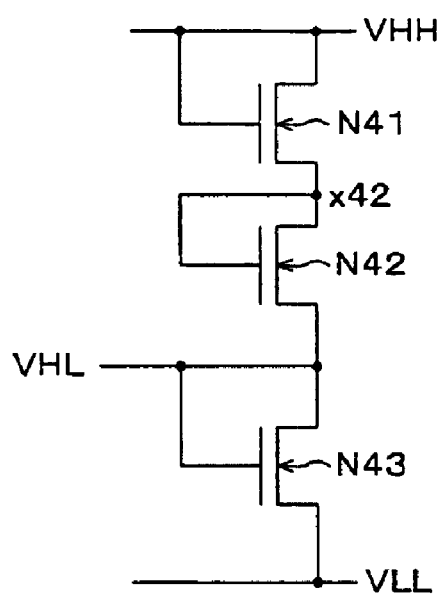
FIGS. 3(a) and 3(b) are circuit diagrams that show other structural examples of a case in which the voltage-dividing section of the level shift circuit is constituted by transistors.
Figure 3:
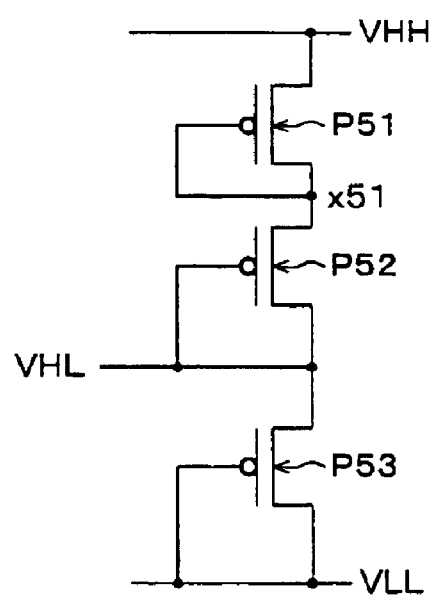

Moreover, as illustrated in FIG. 3(b), even in the case when the PMOS transistors are used in place of the NMOS transistors, the gates of the PMOS transistors may be connected to the drains of their own. In this case, the gate of the PMOS transistor P51 is connected to the x51, the gate of the PMOS transistor P52 is connected to the output voltage VHL, and the gate of the PMOS transistor P53 is connected to the low power-supply voltage VLL.

Figure 4:
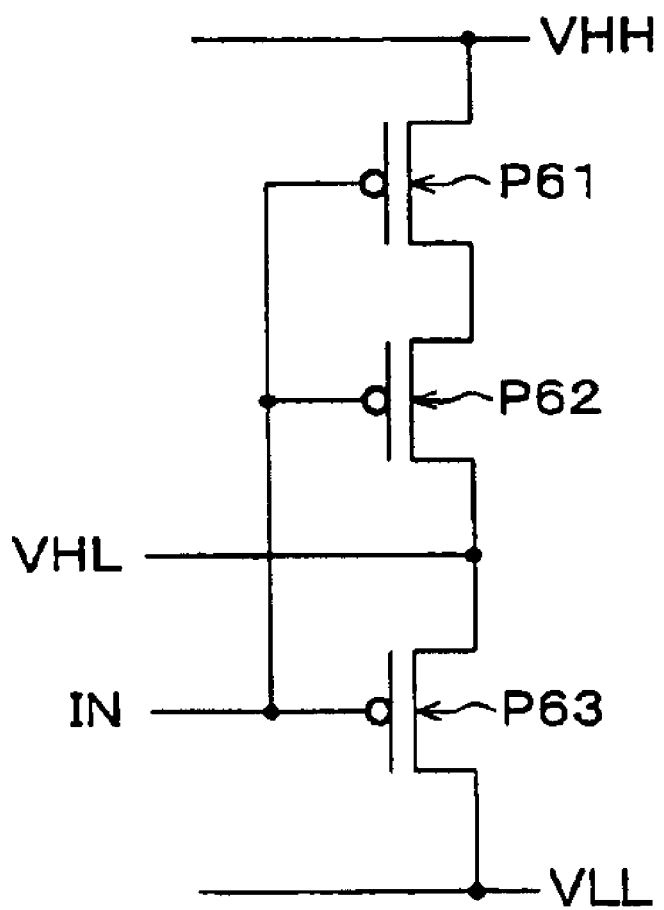
FIG. 4 is a circuit diagram that shows a still another structural example of a case in which the voltage-dividing section of the level shift circuit is constituted by transistors.

Moreover, in the case when the PMOS transistors are used as the resistors to be series-connected between the power supplies VHH and VLL in the voltage-dividing section 3, as illustrated in FIG. 4, the input signal IN may be connected to the gates of these PMOS transistors P61, P62 and P63. In this case, when the input signal IN goes low (VL), the PMOS transistors P61, P62 and P63 are turned on, thereby supplying a voltage VHL to the high power-supply side (VHL) of the inverter section 2.

In contrast, in the case when the input signal IN goes high (VH) in the above-mentioned construction, the voltage applied between the gate and the source of each transistor, becomes smaller than the voltage at the time of the low level, with the result that the resistance between the source and drain becomes higher and the current flowing from the power supply VHH to the power supply VLL becomes smaller; therefore, it is possible to control the current, and also to achieve a reduction in the power consumption.

Moreover, with respect to the resistors in the voltage-dividing section 3, they may be provided by combining the above-mentioned resistor preparation methods.

Figure 5:
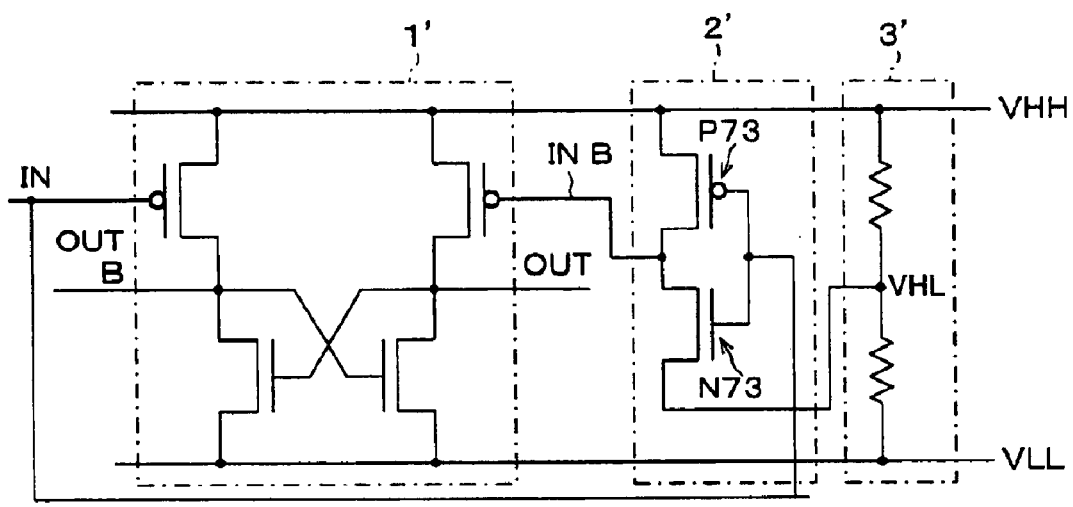
FIG. 5, which shows a modified example of a level shift circuit in accordance with the present invention, is a circuit diagram that shows the structure of a level shift circuit that carries out a low-level shift.

Moreover, in the level shift circuit as described above, upon receipt of the high-level input signal IN, the output signal OUT having a higher level is outputted. In other words, the above-mentioned level shift circuit has a construction for shifting the input signal IN to the high level; however, even in the case of the level shift circuit for shifting the input signal to the low level, it is possible to achieve the present invention by adjusting the output voltage in the voltage-dividing section. FIG. 5 shows a structural example of a level shift circuit for carrying out such a low-level shifting operation.

In the case when the level shift circuit for shifting the input signal to the low level, in an inverter section 2' which, upon receipt of the input signal IN, outputs the inversion input signal IN B to the level shifter section 1', a voltage VHL that has been voltage-divided by the voltage-dividing section 3' is inputted to the source side of an NMOS transistor N73, and the power-supply voltage VHH on the high-voltage side is connected to the source side of the PMOS transistor P73. Thus, it is possible to form a level shift circuit for making a shift to the low level.

The level shift circuit in accordance with the present embodiment is constituted by a level shifter section (level shifter section 1 or level shifter section 1') and an inverter section (inverter section 2 or inverter section 2') that are formed by MOS transistors made of a polysilicon film. Moreover, a voltage-dividing section (voltage-dividing section 3 or voltage-dividing section 3') is also constituted by any of n-type semiconductors, p-type semiconductors, NMOS transistors and PMOS transistors, and formed by the same polysilicon film constituting the level shifter section and the inverter section.

In this manner, the voltage-dividing section is formed by the same polysilicon film as the level shifter section and the inverter section so that the entire level shift circuit can be formed on the same substrate; therefore, the level shift circuit can be manufactured by using a simpler construction without the necessity of voltage-dividing by the use of external resistors, etc.

However, the MOS transistor formed by the polysilicon film has great deviations in the threshold value, and its operative range is limited so that the divided voltage VHL has to be specified. More specifically, in the MOS transistor formed by the polysilicon film has deviations in the range of approximately 2 to 3 V with respect to the designed threshold value. In the case of the NMOS transistor, assuming that the designed value is 3 V, the deviations are in the range of 0 to 6 V, and in the case of the PMOS transistors, assuming that the designed value is −3V, the deviations are in the range of −6 to 0 V.

For this reason, the level shift circuit constituted by the polysilicon transistors having the above-mentioned properties, it is preferable to set the actual operative range of the level shift circuit to become wider by appropriately specifying the voltage VHL with respect to deviations in the threshold value of the polysilicon transistor occurring depending on the lots.

Figure 6:
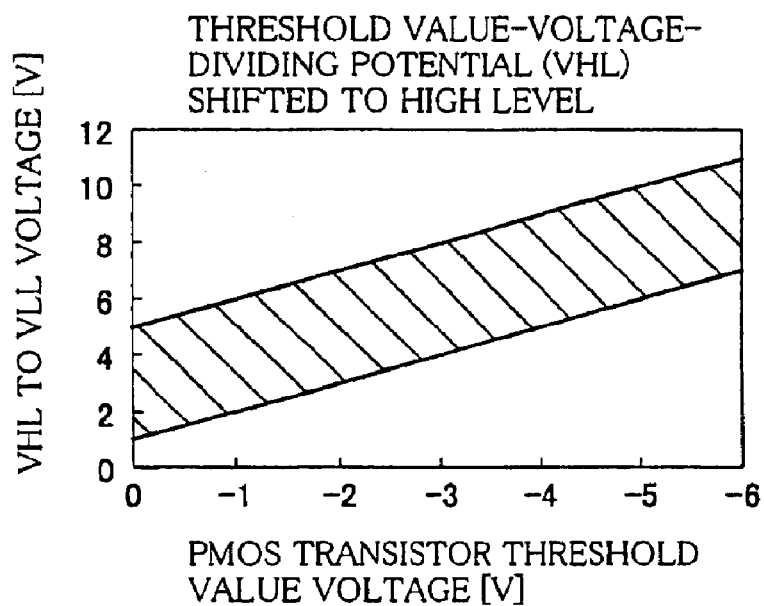
FIGS. 6(a) and 6(b) are graphs that show the relationship between the threshold value and the voltage-dividing potential of a polysilicon transistor that is a PMOS transistor.
Figure 6:
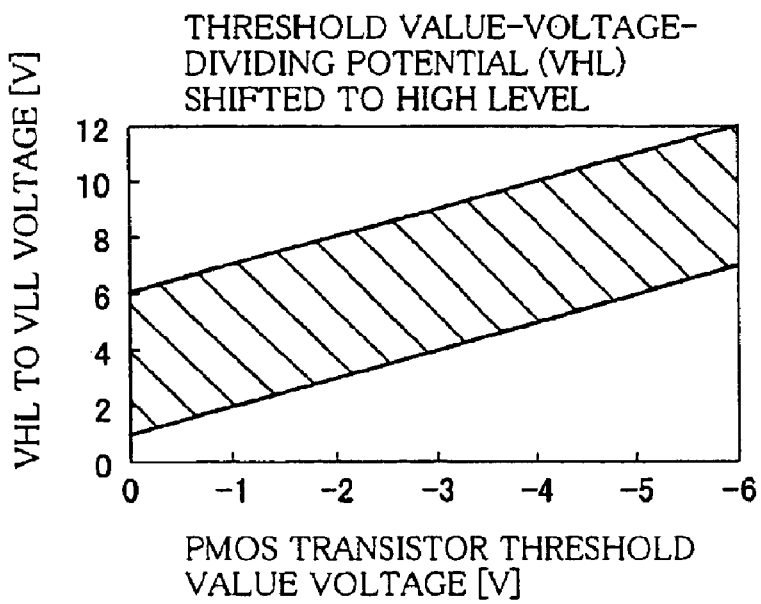

In the level shift circuit having the construction of FIG. 1 which shifts the inputted voltage to the high level, FIG. 6(a) shows the operative range of the PMOS transistor P13 under the input conditions that the VHH to VLL voltage is set to approximately 10 to 20 V, while the input voltage is switched between VLL and VLL+5V. In this Figure, the threshold value of the PMOS transistor is plotted on the axis of abscissa and the VHL to VLL voltage that is obtained by subtracting the voltage VLL from the voltage VHL generated by resistance-dividing the power-supply voltages VHH and VLL is plotted on the axis of ordinate.

In the level shift circuit having the construction of FIG. 1, the voltage VHL, generated by the voltage-dividing section 3, is connected to the source of the PMOS transistor P13 so that the operative range of the PMOS transistor P13 is limited by the relationship between the threshold value of the PMOS transistor P13 and the voltage VHL. More specifically, in the case when (gate input voltage)−(source input voltage)<(threshold value), the PMOS transistor P13 is turned on, and in the case when (gate input voltage)−(source input voltage)>(threshold value), it is turned off.

Here, for example, in the case of the threshold value of −3 V, upon receipt of the input IN of the low level (VLL), the voltage VLL is applied to the gate of the PMOS transistor P13. At this time, in order to turn the PMOS transistor P13 on by the input of the low level, it is necessary for the source input voltage, that is, the voltage VHL, to be greater than VLL+3 V. In fact, in order to ensure the turning-on operation, the voltage VHL needs to be set to not less than VLL+4 V with a margin of 1 V.

In contrast, upon receipt of the high level (VLL+5 V) of the input IN, the voltage VLL+5 V is applied to the gate of the PMOS transistor P13. At this time, in order to turn the PMOS transistor P13 off by the input of the high level, it is necessary for the voltage VHL to be set to not more than VLL+5+3 V. Here, at the time of the turning-off operation of the transistor, it is not necessary to provide a margin (a margin of 1 V) that is required at the time of the turning-on, since the current hardly flows when the gate voltage is not more than the threshold value.

For this reason, in the level shift circuit having the construction of FIG. 1, when the threshold value of the PMOS transistor P13 is −3 V, the voltage VHL is set to a voltage between VLL+4V to VLL+8 V; therefore, the VHL to VLL voltage is allowed to have a driving margin in the range of 4 to 8 V.

At this time, the threshold voltage of the NMOS transistor is not necessarily specified as long as it is set to a voltage that allows the level shifter to operate. More specifically, the operation is available as long as it is set to not more than approximately −1 V that is a voltage between the high level and the low level of the input.

Moreover, even in the case when the threshold value of the PMOS transistor P13 has a value other than −3 V, as illustrated in FIG. 6(a), the VHL to VLL voltage is set to have a driving margin of the same voltage width as in the case of the threshold value of −3 V. Therefore, the PMOS transistor P13 is allowed to have an operative range indicated by a hatched region with slanting lines in the Figure.

Here, as described above, in the case of the PMOS transistor P13 having a designed threshold value of −3 V, there are deviations in the threshold value depending on the lots, and the deviations range from −6 to 0 V; however, the deviations do not occur in the uniform manner and the frequency of the occurrence of the designed threshold value −3 V is the highest. Then, the greater the difference of the threshold value from the designed value (−3 V), the smaller the frequency of the occurrence of the corresponding threshold value.

With respect to the deviations in the threshold value of the PMOS transistor P13, in order to drive the level shift circuit in a stable manner, it is preferable to specify the voltage VHL forming the source input of the PMOS transistor P13 to a value which can be covered by a wider range of the above-mentioned operative range as well as a range close to the designed value of −3 V.

By exemplifying a case shown in FIG. 6(a), an explanation will be given in more detail. With respect to the PMOS transistor P13 having the threshold value of −3V as has been designed, a stable operation is available when the VHL to VLL voltage is set to a given value in the range of 4 to 8 V. However, in the case when the VHL to VLL voltage is specified to 4 V or 8 V, as illustrated in FIG. 6(a), in order to stably operate the PMOS transistor P13, it is necessary to set the threshold value in the range of −6 V to −3 V or −3 V to 0 V; therefore, the width of the permissible range of threshold values in the PMOS transistor P13 is 3 V.

In the case when the VHL to VLL voltage is specified to any value of 5 V, 6 V and 7 V, in order to stably operate the PMOS transistor P13, it is necessary to set the threshold value in the range of −6 to −2 V, −5 to −1 V or −4 to 0V; therefore, the width of the permissible range of threshold values in the PMOS transistor P13 is 4 V. In this manner, by specifying the VHL to VLL voltage (that is, by specifying the voltage VHL), it is possible to widen the permissible range of threshold values in the PMOS transistor P13.

Moreover, in the case when the VHL to VLL voltage is specified to any value of 5 V, 6 V and 7 V, the width of the permissible range of threshold values in the PMOS transistor P13 is 4 V in any one of these cases. Among these, the permissible range of threshold values becomes closest to the designed threshold value −3 V, when the VHL to VLL voltage is specified to 6 V. In other words, in the case when the VHL to VLL voltage is set to 6 V, the frequency of the occurrence of the threshold value within the permissible range of threshold values becomes the highest in the PMOS transistor P13, thereby making it possible to improve the yield of the level shift circuit which enables a stable operation, and consequently to provide a most preferable arrangement.

Here, the above-mentioned explanation has shown a specific example based upon the graph of FIG. 6(a), and the above-mentioned consideration indicates that it is preferable to set the specified value of the voltage VHL to a mean value of the driving margin in the designed threshold value (expected to be the greatest in the frequency of the occurrence) of the PMOS transistor. In the above-mentioned example, the driving margin in the designed threshold value of the PMOS transistor P13 is 4 to 8 V given as the VHL to VLL voltage, and the results show that the mean value, 6 V, forms the most preferable value.

Moreover, the high level of the input voltage to the gate of the PMOS transistor P13 is not particularly limited to the above-mentioned VLL+5 V, and may be set to not less than VLL+5 V. When the high level of the input voltage is set to not less than VLL+5 V, the operational margin of the voltage VHL becomes greater with respect to the PMOS transistor threshold voltage. More specifically, as illustrated in FIG. 6(b), when the high level of the input voltage is raised to VLL+6 V with an increase of 1 V, the upper limit of the margin of the voltage VHL becomes greater by 1 V, and in the same manner, when raised with an increase of 2 V, the margin of the voltage VHL becomes greater by 2 V. In this manner, in proportion to the increase of the input voltage of the high level, it is possible to ensure the margin of the upper limit of the voltage VHL.

In this manner, the increase in the high level of the gate input voltage of the PMOS transistor P13 gives influences on the relationship between the voltage VHL and the PMOS transistor P13, thereby increasing the upper limit of the voltage margin of the voltage VHL. At this time, if the low level input voltage is not changed, the lower limit voltage margin is not changed, with the result that the driving margin becomes greater with respect to the entire threshold value.

In the case of the example shown in FIG. 6(b), the designed threshold value of the PMOS transistor P13 is 3 V, and the driving margin of the PMOS transistor P13 having the threshold value of −3 V is 4 to 9 V given as the VHL to VLL voltage. At this time, the mean value of the driving margin is 6.5 V, and the voltage VHL is specified to VLL+6.5 V. Moreover, in the case when the voltage VHL is specified to VLL+6.5 V, the permissible range of threshold values in the PMOS transistor P13 is set to −0.5 to −5.5 V, with a width of 5 V; therefore, as compared with the case shown in FIG. 6(a), the permissible range of threshold values in the PMOS transistor P13 has an increase of 1 V in width.

The above-mentioned explanation has exemplified the case in which the inputted voltage is shifted to the high level in the level shift circuit having the arrangement shown in FIG. 1; and in the case of a level shift circuit which shifts the inputted voltage to the low level also, by appropriately specifying the voltage VHL with respect to deviations in the threshold value of the polysilicon transistor (NMOS transistor, in the case of the level shift circuit having the arrangement for shifting to the low level) occurring depending on the lots, it is possible to widen the actual application range of the level shift circuit.

In the level shift circuit having the arrangement of FIG. 5 for shifting the inputted voltage to the low level, FIG. 7(a) shows an operative range of the NMOS transistor N73 under the input conditions where the VHH to VLL voltage is set to approximately 10 to 20 V and the input voltage is switched between VLL−5 V and VLL. In this Figure, the threshold value of the NMOS transistor is plotted on the axis of abscissa and the VHH to VHL voltage that is obtained by subtracting the voltage VHH from the voltage VHL generated by resistance-dividing the power-supply voltages VHH and VLL is plotted on the axis of ordinate.

In the level shift circuit having the construction of FIG. 5, the voltage VHL, generated by the voltage-dividing section 3', is connected to the source of the NMOS transistor N73 so that the operative range of the NMOS transistor N73 is limited by the relationship between the threshold value of the NMOS transistor N73 and the voltage VHL.

Here, for example, in the case of the threshold value of 3 V, upon receipt of the input IN of the low level (VHH−5 V), the voltage VHH−5 V is applied to the gate of the NMOS transistor N73. At this time, in order to turn the NMOS transistor N73 off by the input of the low level, it is necessary for the source input voltage, that is, the voltage VHL, to be set to VHH−5−3 V (that is, not less than VHH−8 V).

In contrast, upon receipt of the high level (VHH) of the input IN, the voltage VHH is applied to the gate of the NMOS transistor N73. At this time, in order to turn the NMOS transistor N73 on by the input of the high level, it is necessary for the voltage VHL to be set to not more than VHH−3V. In fact, in order to ensure the turning-on operation, it is necessary to set the voltage VHL to not more than VHH−4 V.

For this reason, in the level shift circuit having the construction of FIG. 5, in the case when the threshold value of the NMOS transistor N73 is 3 V, the voltage VHL is set to a voltage between VHH−4 V and VHH−8 V; therefore, the VHH to VHL voltage has a driving margin of approximately 4 to 8 V.

At this time, the threshold voltage of the PMOS transistor is not necessarily specified as long as it is a voltage that allows the level shifter to operate. More specifically, the operation is available as long as the absolute value of the threshold value of the PMOS transistor is set to not more than approximately −1 V that is a voltage between the high level and the low level of the input.

Figure 7:
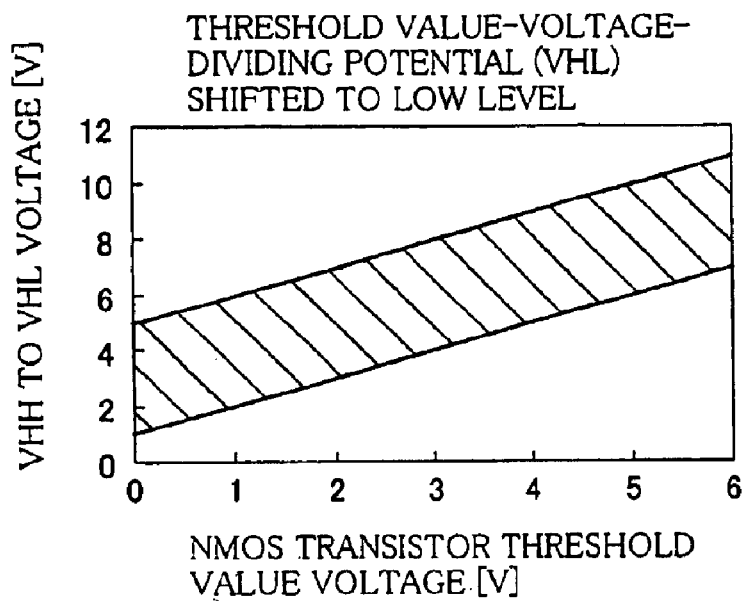
FIGS. 7(a) and 7(b) are graphs that show the relationship between the threshold value and the voltage-dividing potential of a polysilicon transistor that is an NMOS transistor.
Figure 7:
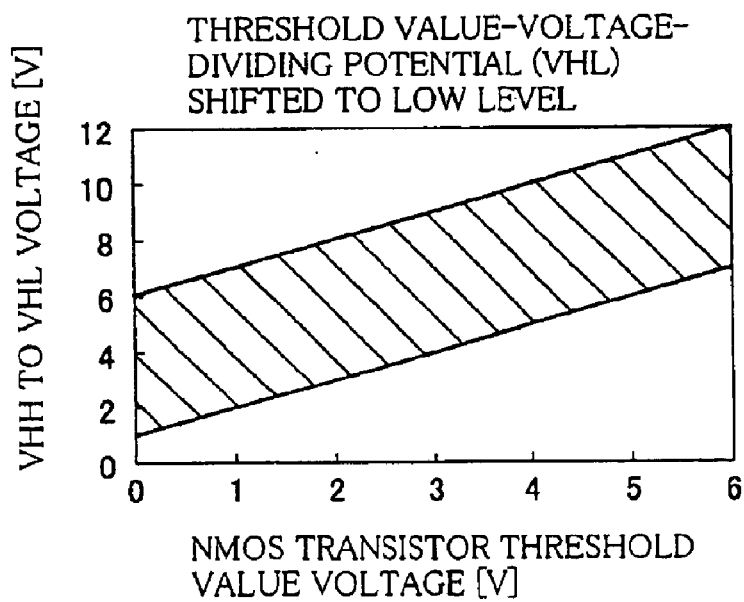

Moreover, even in the case when the threshold value of the NMOS transistor N73 has a value other than 3 V, as illustrated in FIG. 7(*a*), the VHH to VHL voltage is set to have a driving margin of the same voltage width as in the case of the threshold value of 3 V. Therefore, the NMOS transistor N73 is allowed to have an operative range indicated by a hatched region with slanting lines in the Figure.

Here, in the level shift circuit having the construction for shifting the inputted voltage to the low level also, it is preferable to set the specified value of the voltage VHL to a mean value of the driving margin in the designed threshold value (expected to be the greatest in the frequency of the occurrence) of the NMOS transistor. Therefore, in the above-mentioned example based upon the graph of FIG. 7(*a*), the driving margin in the designed threshold value (in this case, 3 V) of the NMOS transistor N73 is 4 to 8 V given as the VHH to VHL voltage, and the mean value, 6 V, is the most preferable value.

Moreover, the low level of the input voltage to the gate of the NMOS transistor N73 is not particularly limited to the above-mentioned VHH−5 V, and may be set to not more than VHH−5 V. When the low level of the input voltage is set to not less than VHH−5 V, the operational margin of the voltage VHL becomes greater with respect to the NMOS transistor threshold voltage. More specifically, as illustrated in FIG. 7(*b*), when the low level of the input voltage is reduced to VHH−6 V with a reduction of 1 V, the upper limit of the margin of the voltage VHL becomes greater by 1 V, and in the same manner, when lowered with a reduction of 2 V, the margin of the voltage VHL becomes greater by 2 V. In this manner, in proportion to the increase of the input voltage of the low level, it is possible to ensure the margin of the upper limit of the voltage VHL.

In this manner, the reduction in the low level of the gate input voltage of the NMOS transistor N73 gives influences on the relationship between the voltage VHL and the NMOS transistor N73, thereby increasing the upper limit of the voltage margin of the voltage VHL. At this time, if the high level input voltage is not changed, the lower limit voltage margin is not changed, with the result that the driving margin becomes greater with respect to the entire threshold value.

In the case of the example shown in FIG. 7(*b*), the designed threshold value of the NMOS transistor N73 is 3 V, and the driving margin of the NMOS transistor N73 having the threshold value of 3 V is 4 to 9 V given as the VHH to VHL voltage. At this time, the mean value of the driving margin is 6.5 V, and the voltage VHL is specified to VHH−6.5 V. Moreover, in the case when the voltage VHL is specified to VHH−6.5 V, the permissible range of threshold values in the NMOS transistor N73 is set to 0.5 to 5.5 V, with a width of 5 V; therefore, as compared with the case shown in FIG. 7(*a*), the permissible range of threshold values has an increase of 1 V in width.

Figure 8:
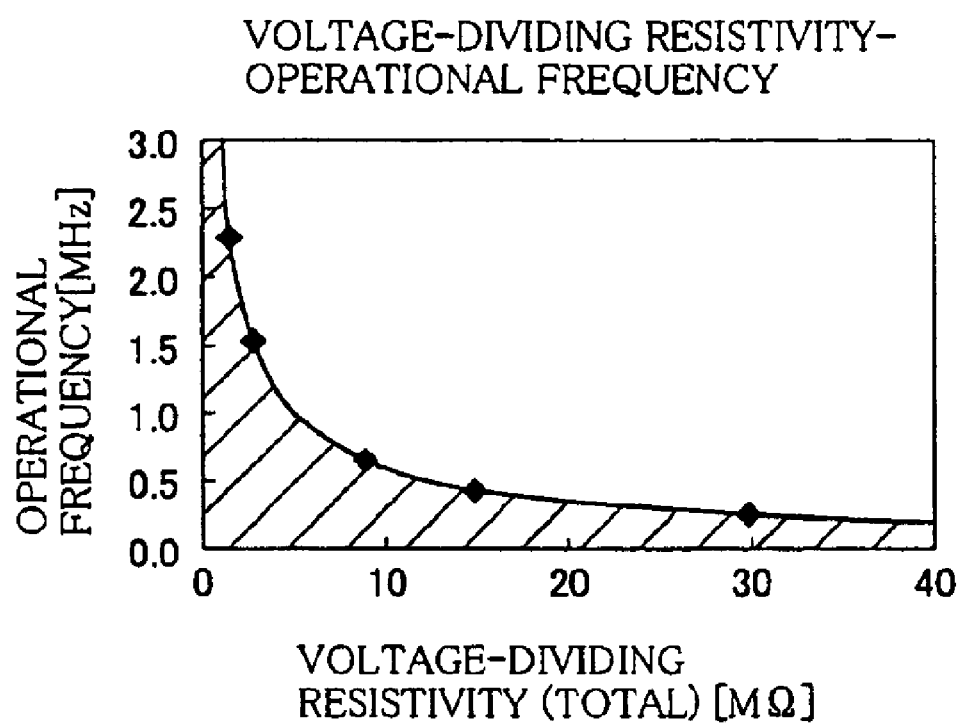
FIG. 8 is a graph that shows the relationship between the total resistance (voltage-dividing resistance) of resistors in a voltage dividing section and the operational frequency of the level shift circuit.

Moreover, in the level shift circuit in accordance with the present embodiment, the total resistance (hereinafter, referred to as voltage-dividing resistance) of the resistors in the voltage-dividing section (3 or 3') is used to determine the operative frequency characteristics. FIG. 8 shows the relationship between the voltage-dividing resistance and the operational frequency of the level shift circuit. In this Figure, the operative region of the level shift circuit is indicated by a hatched region with slanting lines. As clearly shown by the Figure, the smaller the voltage-dividing resistance, the wider the operational frequency in which the level shift circuit becomes operative; however, the greater the voltage-dividing resistance, the smaller the operational frequency in which the level shift circuit becomes operative.

For this reason, the level shift circuit of the present invention is particularly effective in the case when the DC potential which is not dependent on the operational frequency is switched, and it is possible to realize a reduction in the power consumption by increasing the resistance.

With respect to an example of an actual application of the above-mentioned level shift circuit, in an image display device of the active-matrix type, this circuit can be used for generating a signal for carrying out a switching operation using DC at the time of a mode switching, etc. for switching the driving system of the data signal driving circuit or the scanning signal driving circuit. Therefore, it is possible to make the voltage-dividing resistance in the voltage-dividing section as great as possible, and consequently to realize a reduction in the power consumption.

In the present invention, the construction of a level shifter section 1 or 1' is not particularly limited, and any construction may be used as long as the input signal IN and the inversion input signal IN B are required.

Moreover, the constant current value is maintained at a low level by increasing the resistance of the entire level shift circuit; therefore, this circuit is effectively used for a level shifter for DC systems in which an increase in the speed is not particularly required.

As described above, the level shift circuit in accordance with the present embodiment is provided with: a level shifter section 1 having an input signal IN and an inversion input signal IN B formed by inverting the high/low level of the input signal inputted thereto, with VHH that is a high power-supply voltage and VLL that is a low power-supply voltage being connected thereto, which, based upon the high/low level of the input signal IN and inversion input signal INB, switches VHH and VLL to output the resulting voltage; an inverter section 2 having the input signal IN, the power-supply voltage VLL, and a voltage VHL that gives an output level corresponding to the high level of the inversion input signal IN B, inputted thereto, which, based upon the high/low level of the input signal IN, switches the output voltage level so as to generate an inversion input signal IN B formed by inverting the input signal IN; and a voltage-dividing section 3 which voltage-divides and extracts the voltage VHL between the power-supply voltages VHH and VLL.

In the case when the input signal IN and the inversion input signal IN B formed by inverting the input signal IN are required as input signals to the level shift section 1, the voltage VHL that gives the output level corresponding to the low level or the high level of the inversion input signal INB needs to be prepared in addition to the power-supply voltages VHH and VLL that give the low level or the high level of the output signal.

In conventional devices, the voltage VHL has been supplied as a power supply voltage supplied from outside the level shift circuit; therefore, the corresponding terminals have been required. However, in the above-mentioned construction, the voltage VHL is generated by the voltage-dividing processes based upon the power-supply voltages VHH and VLL carried out by the voltage-dividing section 3. For this reason, it is possible to eliminate the terminal through which the voltage VHL is inputted, and consequently to reduce the number of terminals in the level shift circuit.

Moreover, in the level-shift circuit, the voltage-dividing section 3 may have a construction in which: PMOS transistors P61 through P63 are series-connected between the power-supply voltages VHH and VLL, and the input signal IN is connected to the respective gates of these PMOS transistors P61 to P63.

In accordance with the above-mentioned construction, in the case when the input signal IN of the low level is inputted to the respective gates of the PMOS transistors P61 to P63, these PMOS transistors P61 to P63 are turned on, with the result that the voltage VHL is extracted by voltage-dividing process in the voltage-dividing section 3. Moreover, in the case when the input signal IN of the high level is inputted, the gate-to-source voltage of each of the transistors becomes smaller than the voltage at the time of the low level, with the result that the source-to-drain resistance becomes higher, making the current flowing from the power supply VHH to the power supply VLL smaller; thus, it is possible to control the current, and consequently to realize a reduction in the power consumption.

Alternatively, in the above-mentioned level shift circuit, the voltage-dividing section 3 may be constituted by resistors that are series-connected between the power-supply voltages VHH and VLL.

Moreover, in the level shift circuit, it is preferable to form the semiconductors of the respective transistors forming constituent elements or resistors by using polysilicon films.

In the above-mentioned construction, in particular, the transistors and resistors formed in the voltage-dividing section 3 can be formed on the same substrate as the level shift section 1 and the inverter section 2. In other words, the entire level shift circuit can be formed on the same substrate, without the necessity of voltage-dividing by the use of external resistors, etc.; therefore, it is possible to manufacture a level shift circuit by using a simple structure. Furthermore, in the case when the voltage-dividing section 3 is constituted by resistors, the resistors can be placed beneath the wiring pattern depending on layouts, thereby making it possible to miniaturize the layout in some cases.

Moreover, in the above-mentioned level shift circuit, the voltage VHL, extracted by the voltage-dividing section 3, is preferably set to the mean value of the driving margin in the designed threshold value of the transistor (in the present embodiment, the PMOS transistor P13 having the voltage VHL as the source input in the arrangement of FIG. 1, and the NMOS transistor N73 having the voltage VHL as the source input in the arrangement of FIG. 5).

In accordance with the above-mentioned construction, the VHL is set to the mean value of the driving margin in the designed threshold value of a transistor; therefore, even when the threshold value of the transistor in the manufactured level shift circuit is deviated from the designed threshold value, the set value of the voltage VHL is more likely to exist within the driving margin in the threshold value of the transistor (including a case in which it is deviated from the designed value); thus, it is possible to stabilize the operation of the level shift circuit.

Furthermore, in the level shift circuit, the sum total of the resistances in the voltage-dividing section 3 is preferably set to a greater value within the range of the operative frequency in the level shift circuit.

In the above-mentioned construction, the sum total of the resistances in the voltage-dividing section 3 is set to a greater value within the range of the operative frequency in the level shift circuit; therefore, it is possible to reduce the current flowing through the voltage-dividing means, and consequently to realize a reduction in the power consumption of the level shift circuit.

Moreover, in the level-shift circuit of the present invention which, in response to the input signal IN inputted from outside, generates an inversion input signal IN B that is the corresponding inversion signal inside thereof, and based upon the high/low level of the input signal and the inversion input signal, shifts the level of the input signal so as to output the resulting signal, the voltage VHL, which gives the output level of the high level VHL of the inversion input signal IN B, is generated by a resistance division from the power supply voltages VHH and VLL that give the output level of the output signal that has been level-shifted.

In the case when the input signal IN and inversion input signal IN B are used in a conventional level shift circuit, with respect to the inversion input signal IN B, two cases in which it is inputted from outside in the same manner as the input signal IN and in which it is generated inside thereof have been proposed. In the case when the inversion input signal IN B is inputted from outside, the corresponding input terminal is required in the level shift circuit. Moreover, even in the case when the inversion input signal IN B is generated inside thereof, in addition to the power-supply voltages VHH and VLL for providing the output level of the output signal that has been level-shifted, another voltage VHL for providing the output level of the high level (or low level) of the inversion input signal is required; consequently, the corresponding terminal for supplying this voltage VHL is required.

In contrast, in the construction of the level shift circuit of the present invention, the voltage VHL, which gives the output level of the high level (or low level) of the inversion input signal IN B, is generated by a resistance division from the power supply voltages VHH and VLL that give the output level of the output signal that has been level-shifted. That is, in the above-mentioned level shift circuit, only the terminal for inputting the power supply voltages VHH and VLL for providing the output level of the output signal that has been level-shifted is required, resulting in a reduction in the number of the terminals.

Here, in the level shift circuit, the resistors used in the voltage-dividing section 3 may be formed by using, for example, silicon which is doped with a donor or silicon which is doped with an acceptor.

Moreover, in the level shift circuit, the resistors used in the voltage-dividing section 3 may be formed by connecting NMOS transistors in series with each other, with the gate electrodes of the respective transistors being connected to the high power-supply voltage VHH. Alternatively, it may be formed by connecting PMOS transistors in series with each other, with the gate electrodes of the respective transistors being connected to the low power-supply voltage VLL.

Furthermore, in the level shift circuit, the resistors used in the voltage-dividing section 3 may be formed by connecting NMOS transistors in series with each other, with the gate electrodes of the respective transistors being connected to the drains of their own. Alternatively, it may be formed by connecting PMOS transistors in series with each other, with the gate electrodes of the respective transistors being connected to the drains of their own.

The above-mentioned level shift circuit may have an arrangement in which an output signal OUT formed by shifting the input signal IN to the plus side is outputted, or an arrangement in which an output signal OUT formed by shifting the input signal IN to the minus side is outputted.

Moreover, in the above-mentioned level shift circuit, it is preferable to use thin-film transistors as the elements constituting the level shift circuit.

Furthermore, with respect to the image display device in accordance with the present embodiment, an active-matrix type image display device having display pixels arranged in a matrix format is preferably used, and the data signal driving circuit and the scanning signal driving circuit have the above-mentioned level shift circuit.

Figure 9:
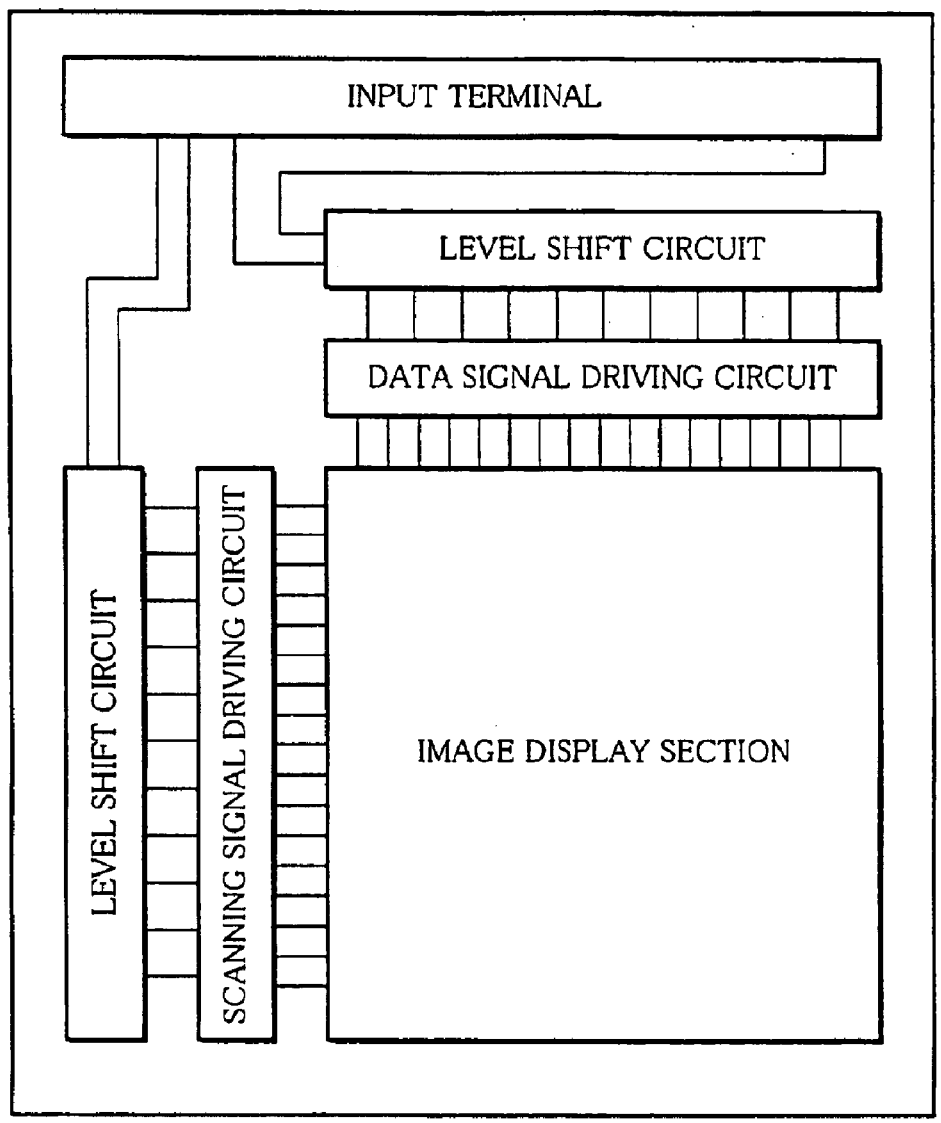
FIG. 9 is an explanatory drawing that shows a structural example of an image display device in which the level shift circuit is used.
Figure 10:
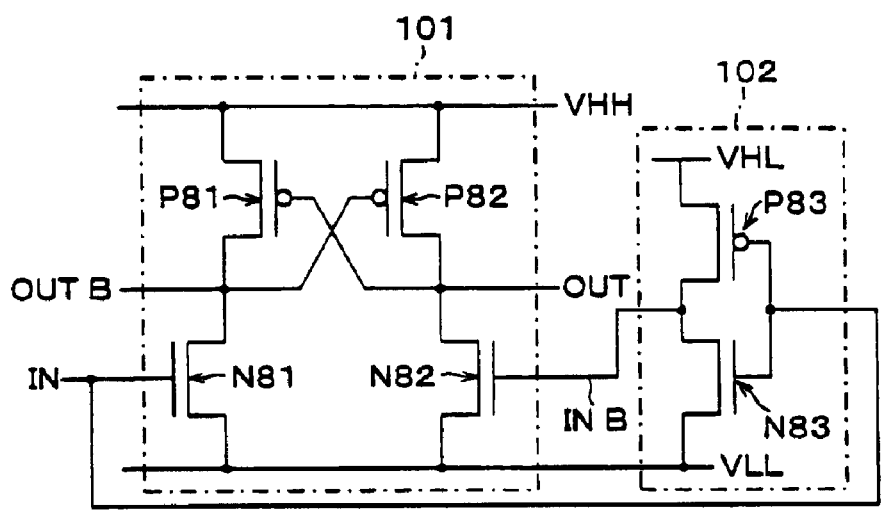
FIG. 10 is a circuit that shows the construction of a conventional level shift circuit.
Figure 11:
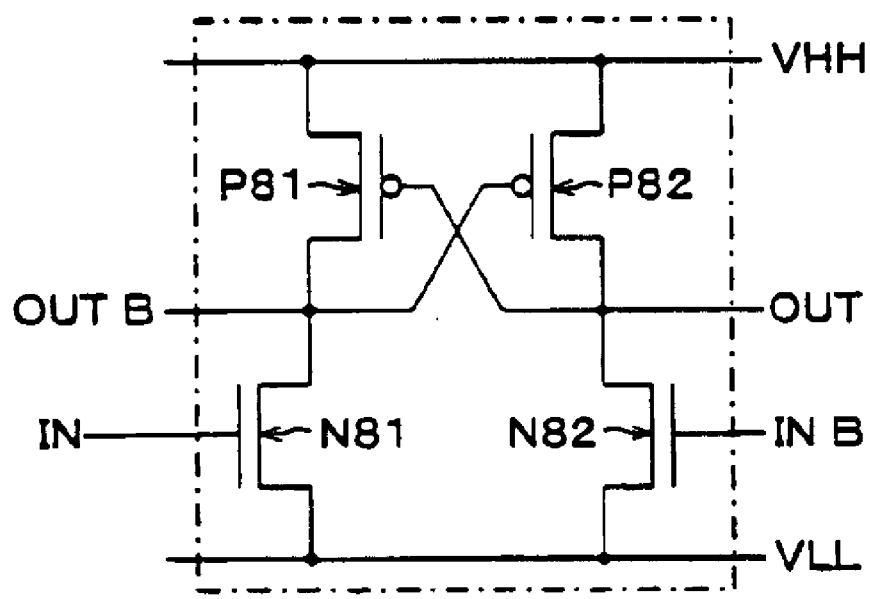
FIG. 11 is a circuit that shows the construction of another conventional level shift circuit.

In other words, as illustrated in FIG. 9, the image displaying operation is carried out as follows: a control signal of a low voltage is inputted from the input terminal, and the level shift circuit of the present invention carries out the level shifting operation to provide a voltage required for the data signal driving circuit and the scanning signal driving circuit; thus, the data signal driving circuit and the scanning signal driving circuit carry out an image displaying operation.

In the above-mentioned image display device, it becomes possible to reduce the number of terminals in the data signal driving circuit and the scanning signal driving circuit.

In the above-mentioned image display device, at least the pixels and the data signal driving circuit and the scanning signal driving circuit are preferably formed on amorphous silicon thin films, polycrystal silicon thin films, or monocrystal silicon thin films.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A level shift circuit comprising:
   a level shifter section, having an input signal and an inversion input signal formed by inverting the high/low level of the input signal inputted thereto, with a first voltage that is a high power-supply voltage and a second voltage that is a low power-supply voltage being connected thereto, which, based upon the high/low level of the input signal and inversion input signal, switches the first voltage and the second voltage to output the resulting voltage;
   an inversion input signal generation section, having the input signal, either of the first voltage and the second voltage, and a third voltage that gives an output level corresponding to the low level or the high level of the inversion input signal, inputted thereto, which, based upon the high/low level of the input signal, switches the output voltage level so as to generate an inversion input signal formed by inverting the input signal; and
   a voltage-dividing section which voltage-divides and extracts the third voltage between the first and second voltages.

2. The level shift circuit as defined in claim 1, wherein the voltage-dividing section is provided with N-channel transistors that are series-connected between the first and second voltages, the first voltage being applied to the gate of each N-channel transistor.

3. The level shift circuit as defined in claim 1, wherein the voltage-dividing section is provided with P-channel transistors that are series-connected between the first and second voltages, the second voltage being applied to the gate of each P-channel transistor.

4. The level shift circuit as defined in claim 1, wherein the voltage-dividing section is provided with N-channel transistors that are series-connected between the first and second voltages, each N-channel transistor having a gate and a drain thereof connected together.

5. The level shift circuit as defined in claim 1, wherein the voltage-dividing section is provided with P-channel transistors that are series-connected between the first and second voltages, each N-channel transistor having a gate and a drain thereof connected together.

6. The level shift circuit as defined in claim 1, wherein the voltage-dividing section is provided with P-channel transistors that are series-connected between the first and second voltages, the input signal being connected to the gate of each P-channel transistor.

7. The level shift circuit as defined in claim 1, wherein the voltage-dividing section is constituted by resistors that are series-connected between the first and second voltages.

8. The level shift circuit as defined in claim 7, wherein the resistors that form constituent elements of the level shift circuit are made of a polysilicon thin film.

9. The level shift circuit as defined in claim 8, wherein the resistors are made of a polysilicon thin film doped with a donor.

10. The level shift circuit as defined in claim 8, wherein the resistors are made of a polysilicon thin film doped with an acceptor.

11. The level shift circuit as defined in claim 1, wherein a transistor semiconductor that forms a constituent element of the level shift circuit is made of a polysilicon thin film.

12. The level shift circuit as defined in claim 11, wherein the third voltage extracted by the voltage-dividing section is set within a driving margin of a designed threshold value of the transistor.

13. The level shift circuit as defined in claim 12, wherein the sum total of resistances in the voltage-dividing section is set to a greater value within a range of operative frequencies of the level shift circuit.

14. The level shift circuit as defined in claim 11, wherein the third voltage extracted by the voltage-dividing section is set at a mean value within a driving margin of a designed threshold value of the transistor.

15. An image display device, which is an active-matrix-type image display device having display pixels arranged in a matrix format,
   wherein each of the data signal driving circuit and the scanning signal driving circuit has a level shift circuit that comprises:
      a level shifter section, having an input signal and an inversion input signal formed by inverting the high/low level of the input signal inputted thereto, with a first voltage that is a high power-supply voltage and a second voltage that is a low power-supply voltage being connected thereto, which, based upon the high/low level of the input signal and inversion input signal, switches the first voltage and the second voltage to output the resulting voltage;

an inversion input signal generation section, having the input signal, either of the first voltage and the second voltage, and a third voltage that gives an output level corresponding to the low level or the high level of the inversion input signal, inputted thereto, which, based upon the high/low level of the input signal, switches the output voltage level so as to generate an inversion input signal formed by inverting the input signal; and a voltage-dividing section which voltage-divides and extracts the third voltage between the first and second voltages.

16. A level shift circuit comprising:

a level shifter connected to a first voltage and a second voltage, the level shifter having a non-inverted input terminal supplied with a non-inverted input signal that changes between a low-level and a high-level, and an inverted input terminal supplied with an inverted input signal;

a voltage divider for dividing the first and second voltages to generate a third voltage; and an inverter connected to the second and third voltages for generating the inverted input signal by inverting the non-inverted input signal.

17. The level shift circuit as defined in claim 16, wherein the level shift circuit shifts the high level of the non-inverted input signal.

18. The level shift circuit as defined in claim 16, wherein the level shift circuit shifts the low level of the non-inverted input signal.

19. The level shift circuit as defined in claim 16, wherein the level shifter comprises:

first and second transistors of opposite channel-conductivity type connected in series between the first and second voltages, third and fourth transistors of opposite channel-conductivity type connected in series between the first and second voltages, an inverted output terminal at a connection node between the first and second transistors, and a non-inverted output terminal at a connection node between third and fourth transistors, wherein the non-inverted input signal is supplied to a gate of the second transistor, the inverted input signal is supplied to a gate of the fourth transistor, the inverted output terminal is connected to a gate of the third transistor and the non-inverted output terminal is connected to a gate of the first transistor.

20. The level shifter circuit as defined in claim 16, wherein the inverter comprises series-connected transistors of opposite channel-conductivity type connected between the second and third voltages, the non-inverted input signal is supplied to gates of the series-connected transistors, and the inverted input signal supplied to the level shifter is derived from a connection node between the connected transistors.

21. The level shift circuit as defined in claim 16, wherein the voltage divider comprises series-connected resistors.

22. A The level shift circuit as defined in claim 16, wherein the voltage divider comprises series-connected transistors.

23. The level shift circuit as defined in claim 22, wherein the voltage divider is configured so that the third voltage is set within a driving margin of a designed threshold value of one of the series-connected transistors.

24. The left shift circuit as defined in claim 22, wherein the voltage divider is configured so that the third voltage is set at a mean value within a driving margin of a designed threshold value of one of the series connected transistors.

25. The level shift circuit as defined in claim 16, wherein the first power supply voltage is a high-level voltage and the second power supply voltage is a low-level voltage.

26. The level shift circuit as defined in claim 16, wherein the first power supply voltage is a low-level voltage and the second power supply voltage is a high-level voltage.

27. An image display device comprising:

display pixels arranged in a matrix format and connected to signal lines;

data signal driving circuitry and scanning signal driving circuitry connected to the signal lines, wherein one or both of the data signal driving circuitry and the scanning signal driving circuitry includes a level shift circuit as defined in claim 16.

28. A level shift circuit comprising:

a level shifter supplied with an input signal and an inverted input signal, the level shifter comprising switching elements connected between first and second power supply voltages;

a voltage divider for dividing the first and second power supply voltages to generate a third voltage; and an inverter comprising first and second switching elements connected in series between the third voltage and one of the first and second power supply voltages, wherein the inverter inverts the input signal and outputs the inverted input signal to the level shifter.

29. The level shift circuit according to claim 28, wherein the switching elements of the level shifter include third and fourth switching elements connected in series between the first and second power supply voltages and fifth and sixth switching elements connected in series between the first and second power supply voltages.

30. An image display device comprising:

display pixels arranged in a matrix format and connected to signal lines;

data signal driving circuitry and scanning signal driving circuitry connected to the signal lines, wherein one or both of the data signal driving circuitry and the scanning signal driving circuitry includes a level shift circuit as defined in claim 28.

* * * * *

UNITED STATES PATENT AND TRADEMARK OFFICE
CERTIFICATE OF CORRECTION

PATENT NO. : 6,741,230 B2
DATED : May 25, 2004
INVENTOR(S) : Sakai et al.

It is certified that error appears in the above-identified patent and that said Letters Patent is hereby corrected as shown below:

Title page,
Item [30], Foreign Application Priority Data, please change "348672"
to -- 2000-348672 --
Item [56], References Cited, U.S. PATENT DOCUMENTS, please add the following:
-- 6,256,025 * 7/2001 Imai et al …...345/211
   5,793,247 * 8/1998 McClure ……327/538 --

Signed and Sealed this

Ninth Day of November, 2004

JON W. DUDAS
*Director of the United States Patent and Trademark Office*